(12) United States Patent
Grassmann et al.

(10) Patent No.: US 10,615,097 B2
(45) Date of Patent: Apr. 7, 2020

(54) CHIP CARRIER WITH ELECTRICALLY CONDUCTIVE LAYER EXTENDING BEYOND THERMALLY CONDUCTIVE DIELECTRIC SHEET

(71) Applicant: Infineon Technologies AG, Neubiberg (DE)

(72) Inventors: Andreas Grassmann, Regensburg (DE); Wolfram Hable, Neumarkt (DE); Juergen Hoegerl, Regensburg (DE); Angela Kessler, Sinzing (DE); Ivan Nikitin, Regensburg (DE); Achim Strass, Munich (DE)

(73) Assignee: Infineon Technologies AG, Neubiberg (DE)

( * ) Notice: Subject to any disclaimer, the term of this patent is extended or adjusted under 35 U.S.C. 154(b) by 53 days.

(21) Appl. No.: 15/730,758

(22) Filed: Oct. 12, 2017

(65) Prior Publication Data

US 2018/0102302 A1   Apr. 12, 2018

(30) Foreign Application Priority Data

Oct. 12, 2016  (DE) .................. 10 2016 119 485

(51) Int. Cl.
*H01L 23/373* (2006.01)
*H01L 23/495* (2006.01)
*H01L 23/433* (2006.01)
*H01L 23/492* (2006.01)
(Continued)

(52) U.S. Cl.
CPC ...... *H01L 23/3735* (2013.01); *H01L 23/4334* (2013.01); *H01L 23/4924* (2013.01); *H01L 23/49562* (2013.01); *H01L 23/49575* (2013.01); *H01L 23/66* (2013.01); *H01L 24/45* (2013.01); *H01L 24/48* (2013.01); *H01L 24/49* (2013.01); *H01L 2224/45014* (2013.01); *H01L 2924/00014* (2013.01); *H01L 2924/1305* (2013.01); *H01L 2924/13055* (2013.01); *H01L 2924/13062* (2013.01); *H01L 2924/13091* (2013.01); *H01L 2924/1517* (2013.01); *H01L 2924/15153* (2013.01); *H01L 2924/181* (2013.01)

(58) Field of Classification Search
CPC . H01L 2224/32221; H01L 2224/48225; H01L 2224/15787
See application file for complete search history.

(56) References Cited

U.S. PATENT DOCUMENTS 5,488,256 A * 1/1996 Tsunoda ............... H01L 23/142
257/691
6,056,186 A   5/2000 Dickson et al.
(Continued)

FOREIGN PATENT DOCUMENTS

DE   3931551 A1   4/1991
DE   4222474 A1   1/1994
(Continued)

*Primary Examiner* — Daniel Whalen

(57) ABSTRACT

A chip carrier which comprises a thermally conductive and electrically insulating sheet, a first electrically conductive structure on a first main surface of the sheet, and a second electrically conductive structure on a second main surface of the sheet, wherein the first electrically conductive structure and the second electrically conductive structure extend beyond a lateral edge of the sheet.

23 Claims, 7 Drawing Sheets

(51) Int. Cl.
H01L 23/66 (2006.01)
H01L 23/00 (2006.01)

(56) References Cited

U.S. PATENT DOCUMENTS

| | | | |
|---|---|---|---|
| 2002/0066953 A1* | 6/2002 | Ishiwata | H01L 23/34 257/700 |
| 2015/0008253 A1 | 1/2015 | Yoon et al. | |
| 2015/0115452 A1* | 4/2015 | Yoon | H01L 24/29 257/762 |
| 2019/0103402 A1* | 4/2019 | Tsuchimochi | H01L 27/0761 |

FOREIGN PATENT DOCUMENTS

| | | |
|---|---|---|
| DE | 4338706 A1 | 5/1995 |
| DE | 4444680 A1 | 6/1996 |
| DE | 10257100 A1 | 1/2004 |
| DE | 102010001668 A1 | 11/2010 |
| DE | 102011075731 A1 | 11/2012 |
| EP | 0632684 A2 | 1/1995 |
| JP | 2005-175130 A | 6/2005 |
| JP | 2008-300476 A | 12/2008 |
| JP | 2012-243890 A | 12/2012 |
| JP | 2013-118299 A | 6/2013 |
| JP | 2014-093304 A | 5/2014 |
| WO | 0249104 A2 | 6/2002 |

* cited by examiner

CHIP CARRIER WITH ELECTRICALLY CONDUCTIVE LAYER EXTENDING BEYOND THERMALLY CONDUCTIVE DIELECTRIC SHEET

BACKGROUND OF THE INVENTION

Field of the Invention

The present invention relates to chip carriers, a package, a vehicle, a method of use, and manufacturing methods.

Description of the Related Art

A power module, for instance for automotive applications, provides a physical containment for one or more power components, usually power semiconductor devices in form of electronic chips comprising one or more integrated circuit components. Examples of integrated circuit components of power modules are an insulated-gate bipolar transistor (IGBT), and a diode.

There is still potentially room to simplify manufacturability of a package while efficiently removing heat and providing extended functionality.

SUMMARY OF THE INVENTION

There may be a need for a chip carrier and a package allowing for an efficient removal of heat generated during operation while simplifying manufacturability and providing extended functionality.

According to an exemplary embodiment, a chip carrier is provided which comprises a thermally conductive and electrically insulating sheet, a first electrically conductive structure (in particular directly, i.e. without additional element in between, or indirectly, i.e. with at least one additional element in between) on a first main surface of the sheet, and a second electrically conductive structure (in particular directly, i.e. without additional element in between, or indirectly, i.e. with at least one additional element in between) on a second main surface of the sheet, wherein the first electrically conductive structure and the second electrically conductive structure extend beyond a lateral edge (in particular an exterior lateral edge) of the sheet.

According to another exemplary embodiment, a chip carrier is provided which comprises a thermally conductive and electrically insulating sheet, a first electrically conductive structure on a first main surface of the sheet, and a second electrically conductive structure on a second main surface of the sheet, wherein at least one (in particular both) of the first electrically conductive structure and the second electrically conductive structure extends beyond a lateral edge of the sheet and has a larger surface (i.e. has a main surface with a larger area than an area of a corresponding main surface of the sheet) than the sheet.

According to another exemplary embodiment, a package (such as a power package) is provided which comprises a chip carrier having the above-mentioned features, at least one electronic chip (such as a semiconductor chip) mounted on the first electrically conductive structure of the chip carrier, and an encapsulant encapsulating at least part of the at least one electronic chip and at least part of the chip carrier.

According to still another exemplary embodiment, a method of manufacturing a chip carrier is provided, wherein the method comprises interconnecting a thermally conductive and electrically insulating sheet, a first electrically conductive structure on a first main surface of the sheet, and a second electrically conductive structure on a second main surface of the sheet, and configuring one or both of the first electrically conductive structure and the second electrically conductive structure to extend beyond a lateral edge of the sheet.

According to yet another exemplary embodiment, a method of manufacturing a package is provided, wherein the method comprises providing a chip carrier having the above-mentioned features, mounting at least one electronic chip on the first electrically conductive structure of the chip carrier, and encapsulating at least part of the at least one electronic chip and at least part of the chip carrier by an encapsulant.

According to still another exemplary embodiment, a vehicle is provided which comprises a chip carrier having the above mentioned features or a package having the above mentioned features.

According to yet another exemplary embodiment, a chip carrier having the above mentioned features or a package having the above mentioned features is used for an automotive application.

According to an exemplary embodiment of the invention, a chip carrier and a corresponding package are provided in which the exterior lateral edges of the chip carrier are not defined by an electrically insulating and thermally conductive sheet, but in contrast to this by one or both electrically conductive structures being arranged on the two opposing main surfaces of the sheet. In contrast to conventional approaches (in which for instance a Direct Copper Bonding (DCB) substrate has a dielectric thermally conductive sheet with carrier function on which only partial areas of its main surfaces are covered by copper foils), exemplary embodiments of the invention implement an architecture in which one or even both of electrically conductive structures on main surfaces of the dielectric thermally conductive sheet has or have a larger extension than the dielectric thermally conductive sheet. By taking this measure, the cost and weight of the chip carrier and the package may be reduced, since the dimension of the dielectric thermally conductive sheet may be significantly reduced without compromising on the functionality of the chip carrier. On the contrary, by arranging one or both electrically conductive structures on the main surfaces of the thermally conductive and electrically insulating sheet with an area which extends beyond the extension of the electrically insulating and thermally conductive sheet, the electric functionality of the chip carrier may be even increased. For example, one of the electrically conductive structures, in particular the one being fully embedded in an encapsulant of the package, may not only serve as an electric mounting base for an electronic chip, but may even extend out of the encapsulant so as to provide additionally also the function of a wiring structure electrically coupling an exterior with an interior of the package. Moreover, it has been surprisingly found that even heat spreading in a package with a chip carrier with retracted dielectric thermally conductive sheet according to an exemplary embodiment is not significantly reduced compared to a conventional architecture with a very expensive dielectric thermally conductive sheet with large size. Thus, a chip carrier and a corresponding package may be provided which provide a high thermal performance, an increased flexibility of use and an extended functionality, while being manufacturable with low effort and with a high compactness. In particular when both electrically conductive structures extend laterally beyond the side limits of the dielectric thermally conductive sheet, a recess or undercut may be formed at a side of the layer stack. This recess may be filled with encapsulant material upon encapsulation, which improves adhesion and prevents delamination.

DESCRIPTION OF FURTHER EXEMPLARY EMBODIMENTS

In the following, further exemplary embodiments of the chip carriers, the package, the vehicle, and the methods will be explained.

In an embodiment, the thermally conductive and electrically insulating sheet is a connected structure, for instance a continuous layer or a patterned layer. However, in another embodiment, the thermally conductive and electrically insulating sheet may be composed of multiple separate (and preferably coplanar) islands, which are provided only at certain positions of the chip carrier at which a thermally conductive and electrically insulating sheet is required (for instance at one or more mounting positions of one or more electronic chips to be mounted on the chip carrier, and/or in one or more regions where a mechanical support is required). This results in a compact configuration which can be manufactured with low effort.

In an embodiment, at least one of the first electrically conductive structure and the second electrically conductive structure has a larger surface area than the sheet. In other words, a main surface of the thermally conductive and electrically insulating sheet may be smaller than one of the main surfaces of the respective electrically conductive structure. In such an embodiment, only part of the respective electrically conductive structure is in direct contact with the thermally conductive and electrically insulating sheet, whereas another part of the respective electrically conductive structure may extend beyond the lateral limits of the thermally conductive and electrically insulating sheet, for instance forming sort of overhanging structure. The area of functional activity of the corresponding electrically conductive structure may therefore be extended beyond the lateral limits of the thermally conductive and electrically insulating sheet.

In an embodiment, at least one of the first electrically conductive structure and the second electrically conductive structure has a larger thickness than the sheet. By taking this measure, the electric conductivity may be increased and the electrical resistance may be reduced which renders the chip carrier suitable for low loss electrical applications. Moreover, the relative amount of needed usually expensive thermally conductive and electrically insulating sheet material may be advantageously reduced.

In an embodiment, the first electrically conductive structure comprises at least one mounting area configured for mounting an electronic chip. Such a mounting area may be defined by the provision of a solder structure or another material appropriate for mechanically mounting and/or electrically coupling the electronic chip.

In an embodiment, the first electrically conductive structure additionally comprises at least one further functional element. In view of the increased size of the respective electrically conductive structure, it is also possible to implement one or more further functions, in particular electric functions.

In an embodiment, the at least one further functional element comprises at least one lead (such as at least one power pin and/or at least one signal pin) for electrically connecting the electronic chip. By providing a patterned electrically conductive layer or sheet, in which one or more leads extend beyond the lateral edges of the thermally conductive and electrically insulating sheet, a separate lead structure, for instance a separate leadframe, may be omitted. This increases compactness of the chip carrier and the package and reduces the effort of manufacturing chip carrier and package.

In an embodiment, the second electrically conductive structure is configured as a continuous layer. Thus, with such a continuous electrically conductive layer, proper heat removal of heat generated by the at least one electronic chip during operation of the package may be improved. Further, a high contact area for mounting the package at the continuous exterior electrically conductive layer can be increased.

In an embodiment, a recess is formed in the sheet (more precisely at a retracted sheet position) at a lateral edge of a stack composed of the sheet, the first electrically conductive structure and the second electrically conductive structure. Such a recess or undercut may be for instance circumferentially closed, and may therefore extend around a perimeter of the chip carrier. By taking this measure, an undercut may be formed which may be filled by encapsulant material during encapsulation in terms of manufacturing the package. Thus, the mechanical integrity of the so formed package may be improved and delamination between the chip carrier and the encapsulant may be suppressed.

In an embodiment, the chip carrier comprises a guide frame which may be integrally formed with (or may be provided separately from) the first electrically conductive structure and carrying the first electrically conductive structure.

Such an annular guide frame may be used as a temporary carrier for supporting portions of the respective electrically conductive structure extending beyond the thermally conductive and electrically insulating sheet. Therefore, precision and reliability of the manufactured package may be very high.

In an embodiment, the guide frame has a hole in which the first electrically conductive structure is exposed to the sheet. Therefore, substantially the entire surface of the respective electrically conductive structure may be supported prior to the removal of the temporary guide structure during manufacturing a package based on the chip carrier. For instance, the sheet and the guide frame may together form a planar structure, for instance a patterned layer, and may be advantageously embodied as a common stamping part.

In an embodiment, the package comprises a further chip carrier (in particular also having the above mentioned features) being mounted on or above the at least one electronic chip, i.e. on another side of the electronic chip(s) opposing the chip carrier. Thus, the one or more electronic chips may be sandwiched between opposing main surfaces of two chip carriers which are preferably both of the type having at least one electrically conductive structure on at least one main surface of the respective thermally conductive and electrically insulating sheet extending beyond the lateral limits of the latter. By taking this measure, the functionality of the package as a whole may be further increased. It should be said that this sandwiching of the one or more electronic chips between the two chip carriers may be a direct sandwiching, i.e. without other structures in between, or an indirect sandwiching with one or more other structures in between, for instance one or more spacer blocks (as described in the following).

In an embodiment, the package comprises a spacer body, in particular a thermally conductive spacer body, between the at least one electronic chip and the further chip carrier. Such one or more spacer bodies may for instance be embodied as copper blocks which allow an adaptation of the vertical dimensions of the package. They may be made of a thermally highly conductive material such as copper so as to additionally contribute to the heat removal of the double-sided cooling package.

In an embodiment, the second electrically conductive structure of at least one of the chip carrier and the further chip carrier forms part of an exterior surface of the package. Such an exterior surface may be coupled with a thermal interface material, with cooling fluid, with cooling fins, and/or a cooling body for efficient heat removal.

In an embodiment, the package is configured for double-sided cooling (for instance by the provision of two chip carriers of the above described type forming part of two opposing main surfaces of the package). By double-sided cooling it is meant that heat generated during operation of the package can be dissipated from the package via both opposing main surfaces thereof. Such a double-sided cooling architecture, which is particularly appropriate for power semiconductor applications, is perfectly compatible with the chip carrier architecture according to an exemplary embodiment of the invention.

In an embodiment, at least one lead of the first electrically conductive structure of the chip carrier extends beyond the encapsulant. Thus, a separate leadframe may be omitted, since the respective first electrically conductive structure (on which the at least one electronic chip is mounted and being encapsulated by encapsulant material) may extend laterally beyond the encapsulant and may therefore serve for electrically contacting the at least one encapsulated electronic chip. This integration of the leadframe functionality in one of the electrically conductive structures on the thermally conductive and electrically insulating sheet of the chip carrier allows to manufacture particularly compact and lightweight packages.

In an embodiment, at least one lead of the first electrically conductive structure of the chip carrier is electrically connected with the at least one electronic chip, in particular using at least one of the group consisting of at least one bond wire (which may be an appropriate measure in particular for connecting one or more signal pins) and at least one bond ribbon (which may be an appropriate measure in particular for connecting one or more power pins). This connection architecture renders a separate lead frame dispensable.

In an embodiment, the method comprises providing a connecting medium between the sheet and at least one of the first electrically conductive structure and the second electrically conductive structure. In view of the overlapping geometry of the electrically conductive structure(s) of the chip carrier over the sheet, it is of particular advantage that a connection medium between sheet and respective electrically conductive structure improves adhesion and suppresses delamination. This increases reliability of the manufactured package.

In an embodiment, the connecting medium comprises a solder material. A solder connection between the thermally conductive and electrically insulating sheet on the one hand and the respective electrically conductive structure on the other hand provides a robust and reliable mechanical connection even under harsh conditions such as high thermal load.

In an embodiment, the interconnecting comprises heating, in particular in at least one of a vacuum environment, a protection gas atmosphere, a forming gas atmosphere, and the presence of a mechanical pressing force. Interconnecting the sheet with the electrically conductive structures by the supply of thermal energy has turned out as a powerful measure to manufacture a reliable chip carrier, in particular when a protection gas atmosphere, a vacuum, a forming gas and/or a mechanical pressing force is or are applied during this heating procedure.

In an embodiment, the method comprises providing a guide frame carrying the first electrically conductive structure before the interconnecting, and removing the guide frame from the manufactured chip carrier after formation of a package using the chip carrier. The guiding frame may thus serve as a temporary carrier for supporting one or more overhanging portions of the first electrically conductive structures simplifying handling and preventing undesired bending of the chip carrier during manufacture of the chip carrier and of a package using this chip carrier. This also contributes to the suppression of internal stress within the chip carrier and therefore improves the reliability of the package. Before a package is readily manufactured, the guide frame may be removed from the rest of the package so that it does not form part of the final product. The guide frame may be integrally formed with the first electrically conductive structure (for instance as a common stamping part, for example made from a copper sheet).

In an embodiment, the method comprises roughening at least one of the first electrically conductive structure and the second electrically conductive structure. Roughening before encapsulation has the advantage that the adhesion between the first electrically conductive structure and the encapsulant material can be significantly improved. This efficiently suppresses delamination of the constituents of the package. Advantageously, surface roughening may be accomplished prior to attaching the electronic chip, since this protects the sensitive electronic chip from damage resulting from an interaction with a chemistry which may be advantageously used for roughening. As an alternative to the roughening of at least one of the electrically conductive structures prior to the die attach, it is also possible to attach an adhesion promoter on at least one of the electrically conductive structures after the die attach.

In an embodiment, the encapsulant comprises a mold compound. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity may be embedded in an epoxy-based matrix of the encapsulant.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the carrier. In such an embodiment, double-sided cooling is of high importance.

In embodiments, the semiconductor chips may form a circuit functioning as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the power module or package is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the module or package according to an exemplary embodiment is fully compatible with standard packaging concepts (in particular fully compatible with standard TO packaging concepts) and appears externally as a conventional module or package, which is highly user-convenient. In an embodiment, the package is configured as power module, for instance a molded power module.

As substrate or wafer forming the basis of the semiconductor chip(s) or electronic chip(s), a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION OF EXEMPLARY EMBODIMENTS

Figure 1:
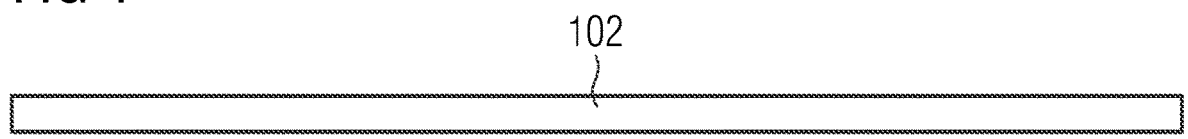
FIG. 1 to FIG. 3 show cross-sectional views of structures obtained during manufacturing a chip carrier according to an exemplary embodiment.

The illustration in the drawing is schematically.

Before describing further exemplary embodiments in further detail, some basic considerations of the present inventors will be summarized based on which exemplary embodiments have been developed which provide for an efficient cooling of a simply manufacturable package.

According to an exemplary embodiment of the invention, a minimal substrate for double-sided cooling packages is provided.

Conventional chip carriers are, among others, Direct Copper Bonding substrates (DCB), Insulated Metal Substrates (IMS), etc. However, with all these concepts, heat removal in a package with an encapsulated chip is accomplished only via one side. For power semiconductor applications, this may not be sufficient. Furthermore, the cost for such conventional chip carriers is high due to the high cost of a required large area of a thermally conductive structure of the mentioned and other substrates.

According to an exemplary embodiment of the invention, a package is provided which may be preferably configured in a double-sided cooling architecture. Highly preferable, such a package may be manufactured based on a chip carrier which has one or two electrically conductive structures on opposing main surfaces of a thermally conductive and electrically insulating sheet which extend beyond the lateral limits of the sheet. Such a chip carrier allows to decouple the size of the thermally conductive and electrically insulating sheet from the dimension of the metallic carrier foils, i.e. the electrically conductive structures. Thus, an increase of the usable electrically conductive surface of such a chip carrier is achievable without an increase of the required amount of thermally conductive and electrically insulating material. This saves costs and allows to manufacture compact packages. Furthermore, it is possible with such an architecture to reduce the number of required individual parts of a package, since the functionality of at least two conventionally separate elements can be combined or integrated in one of the electrically conductive structures with extended area. For instance, such an electrically conductive structure may simultaneously serve as a mounting base for the electronic chip(s) and to provide one or more leads extending beyond an encapsulant of a package using such a chip carrier. Furthermore, the chip carrier architecture according to an exemplary embodiment of the invention allows for a full decoupling of the individual sheets or layers of the chip carrier.

According to an exemplary embodiment, a chip carrier is provided which is composed of three layer type structures of different functionality. One of the electrically conductive structures may be configured as a carrier of an electric potential, the other electrically conductive structure may be configured as an exterior layer of the package contributing to an efficient heat removal, and the core sheet of the thermally conductive and electrically insulating material may provide electrical isolation and may also contribute to the removal of heat generated by the one or more electronic chips integrated within the package during operation.

Advantageously, the dielectric high performance thermal sheet is spatially smaller than the electrically conductive layers above and below. By correspondingly getting rid of constraints or limitations in terms of a possible size of one or both of the electrically conductive structures, it is possible to integrate at least one further function in such a spatially expanded electrically conductive structure. For instance, such an additional function may be a replacement of a leadframe. Therefore, such an electrically conductive structure may form at least part of the encapsulant external contacts or leads of the readily manufactured package. Such leads may be power pins and/or signal pins.

Hollow spaces or recesses formed by such an architecture with a spatially excessive chip carrier may be filled by an encapsulant such as a resin type encapsulant, for example a mold compound. By taking this measure, protection of the interior of the package with regard to an environment may be achieved. Such an encapsulant filling gaps, spaces, voids or recesses may also provide a reliable electric isolation in the filled volume in order to provide a dielectric decoupling between copper areas which can be used for redistribution and/or heat spreading.

With the chip carrier architecture according to exemplary embodiments of the invention, it is possible to manufacture three-dimensional chip carriers at reasonable effort, wherein dimension and/or thickness of the electrically conductive structures (in particular copper layers) are substantially independent of the size of the sandwiched thermally highly conductive insulating material.

According to an exemplary embodiment of the invention, a package (in particular implementing double-sided cooling, wherein single-sided cooling is possible in other embodiments as well) may be provided, in which the thermally highly conductive sheet(s) above the at least one chip and/or below the at least one chip is or are configured so that they have a smaller area than its inner and outer electrically conductive cover structures or layers. These electrically conductive structures may be used for electrical redistribution tasks and/or for heat spreading.

A volume between the electrically conductive structures can be advantageously filled partially or entirely with an appropriate encapsulant such as a mold component (for instance based on an epoxy resin). The encapsulant may at least partially define the outline of the package.

In contrast to conventional approaches (in which a separate leadframe is used to electrically contact one or more electronic chips with an exterior of the encapsulated package and which may provide signal pins as well as power pins), a separate leadframe may be omitted, and its functions may be realized by part of the chip carrier, more precisely by at least one of its electrically conductive structures. In other words, the leadframe functionality may be integrated within the chip carrier or substrate, in particular by a package interior electrically conductive structure of the chip carrier. This allows to manufacture a compact package with low tendency of undesired delamination.

For example, the thermally conductive and electrically insulating sheet may be made of a ceramic material (such as aluminum oxide, silicon nitride or aluminum nitride). For instance, the thermally conductive and electrically insulating sheet may have a thermal conductivity of at least 10 W/mK, in particular of at least 50 W/mK, more particularly of at least 100 W/mK.

The material of the electrically conductive structures may be for instance copper or aluminium having both a high thermal conductivity and a high electrical conductivity.

Figure 2:
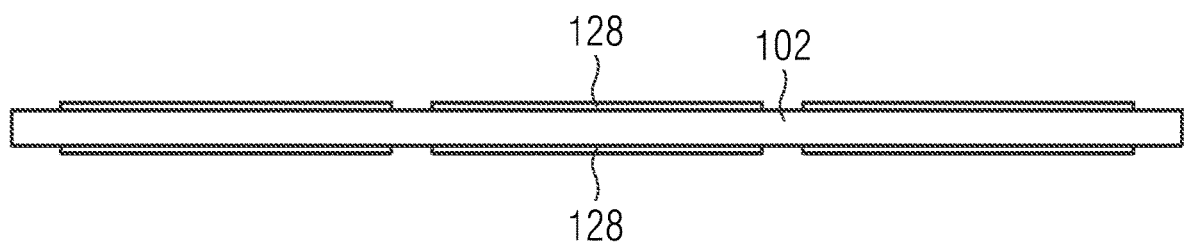
Figure 3:
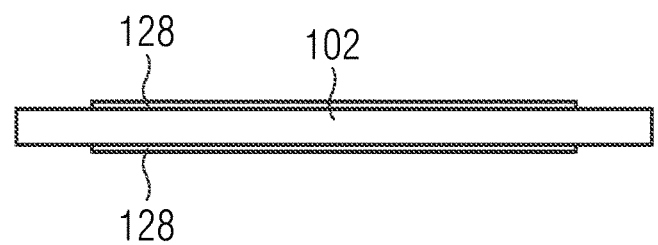

FIG. 1 to FIG. 3 show cross-sectional views of structures obtained during manufacturing a chip carrier 100 according to an exemplary embodiment.

As can be taken from FIG. 1, starting point of the manufacturing process of manufacturing chip carrier 100 and finally package 120 is a ceramic plate constituting a thermally conductive and electrically insulating sheet 102. The thermally conductive and electrically insulating sheet 102 can be a ceramic with a high thermal conductivity and a robustness against breakage, for instance silicon nitride ($Si_3N_4$). The thickness of the thermally conductive and electrically insulating sheet 102 can be selected in accordance with a voltage breakthrough performance required by a certain application. Also, the thickness of the thermally conductive and electrically insulating sheet 102 may be selected in accordance with a required gap or space between two opposing electrically conductive structures 104, 106 to be applied on the two opposing main surfaces of the thermally conductive and electrically insulating sheet 102 (see FIG. 4). Also the mold flow behaviour of an encapsulant material used for encapsulation of the package 120 may be considered for the selection of the thickness.

Referring to FIG. 2, a connecting medium 128 is applied on both opposing main surfaces of the thermally conductive and electrically insulating sheet 102. Later, the connecting medium 128 will be provided between the sheet 102 and each of the first electrically conductive structure 104 and the second electrically conductive structure 106.

As can be taken from FIG. 2, the two opposing main surfaces of the sheet 102 are covered by layer sections of the connecting medium 128. The thermally conductive and electrically insulating sheet 102 shown in FIG. 2 may be used for manufacturing multiple chip carriers 100, wherein each pair of opposing layer sections of the connection medium 128 corresponds to one chip carrier 100, compare FIG. 3. The connection medium 128 may be applied to the respective surface portions of the thermally conductive and electrically insulating sheet 102 by screen printing. As can be taken from FIG. 2, double-sided coverage of the thermally conductive and electrically insulating sheet 102 by the connection medium 128 is accomplished. In order to promote adhesion with subsequently applied copper material, the connection medium 128 may comprise a solder material (such as silver) as well as an adhesion promoting contribution (for instance titanium). Printing of the connection medium 128 on the two opposing main surfaces of the thermally conductive and electrically insulating sheet 102 may be carried out in accordance with the positions of the later applied copper material. A negative aperture may be adjusted, so that the printed regions of connection medium 128 may be smaller than the copper structures applied thereafter.

Care should be taken that the material of the connection medium 128 does not cover undesired surface portions of the thermally conductive and electrically insulating sheet 102, so that a reliable galvanic separation between the two opposing electrically conductive structures 104, 106 can be ensured. Any remaining exposed material of the connection medium 128 may be removed after mounting the electrically conductive structures 104, 106 on the two opposing main surfaces of the thermally conductive and electrically insulating sheet 102.

After this printing procedure, the structure shown in FIG. 2 can be singularized in a plurality of separate pieces, wherein each of the pieces may serve as a basis for manufacturing a respective chip carrier 100. FIG. 3 shows the result of such a singularization procedure. For singularizing the semifinished product shown in FIG. 2, trenches may be sawn by a laser, and the resulting structure may be singularized by breaking it into the separate pieces shown in FIG. 3. When rough side surfaces are formed by such a breaking procedure, this has an additional advantageous effect on the adhesion with an encapsulant material in a later encapsulation procedure.

Figure 4:
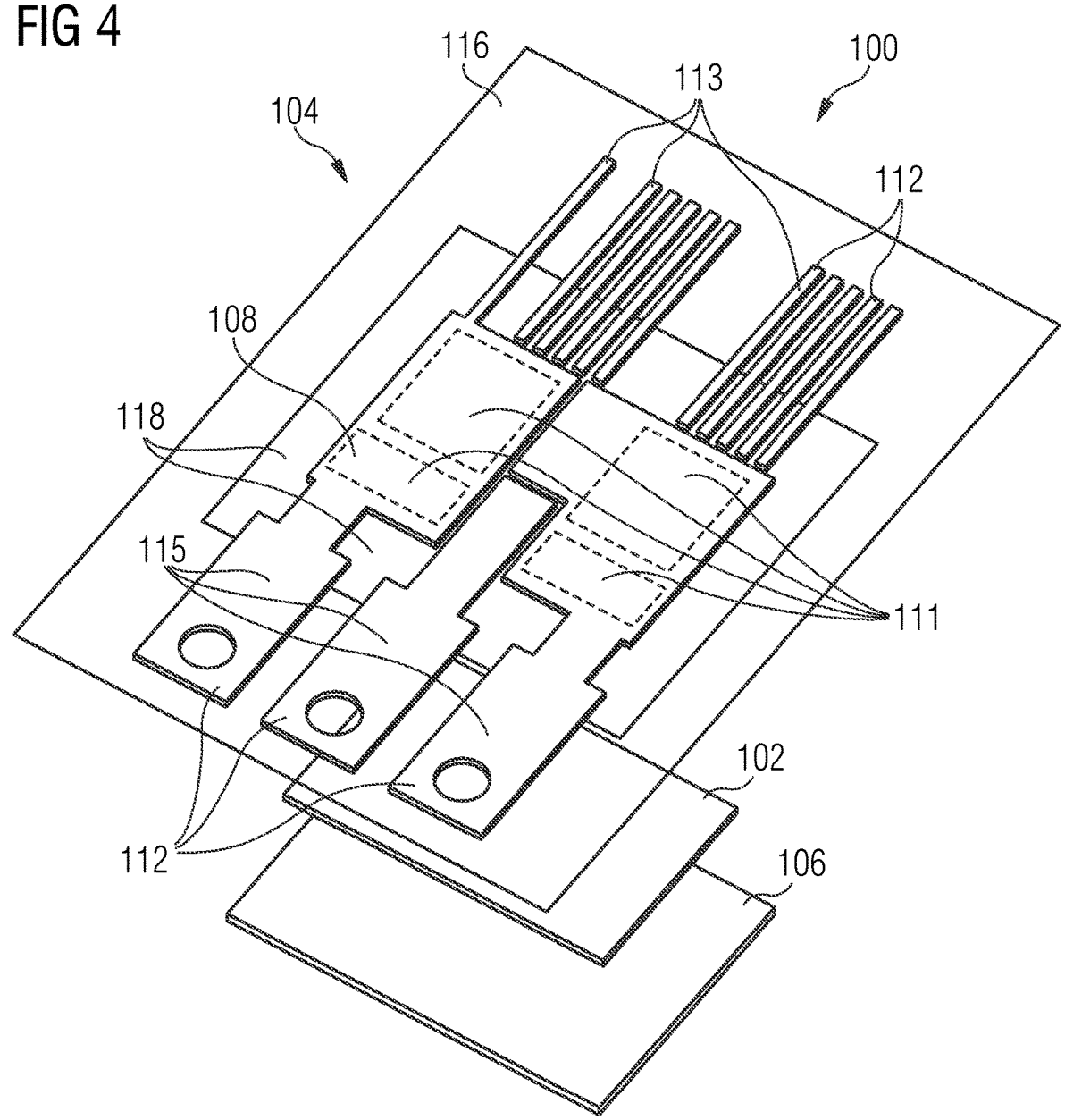
FIG. 4 shows an exploded view of components of a pre-form of a chip carrier according to an exemplary embodiment of the invention.

FIG. 4 shows an exploded view of components of a pre-form of a chip carrier 100 according to an exemplary embodiment of the invention.

Referring to FIG. 4, the thermally conductive and electrically insulating sheet 102 (which may be made of a ceramic, for instance aluminum oxide, silicon nitride, aluminum nitride) is interconnected with first electrically conductive structure 104 (which is here embodied as a patterned copper sheet, including a mounting area 108 with four mounting bases 111 for mounting four electronic chips 110, signal pins 113 and power pins 115 as well as an auxiliary guide frame 116) with the connection medium 128 in between. The guide frame 116 serves as temporary carrier for the electrically conductive structure 104 and provides stability during the manufacturing process. This is contrary to conventional Direct Copper Bonding (DCB) substrates, in which a ceramic sheet serves as a carrier for two copper sheets. Furthermore, the thermally conductive and electrically insulating sheet 102 is interconnected on its other main surface with second electrically conductive structure 106 (which is here embodied as a continuous copper sheet) with the connection medium 128 in between. The first electrically conductive structure 104 may for instance be a stamping part, for instance made of copper. The second electrically conductive structure 106 may for instance be a planar continuous metal sheet, for example a copper sheet. The connection medium 128 contributes to a proper interconnection between the mentioned constituents. As can be taken from FIG. 4, both the first electrically conductive structure 104 and the second electrically conductive structure 106 extend beyond an outer lateral edge of the sheet 102 and each have a larger surface area than the thermally conductive and electrically insulating sheet 102. The described interconnecting procedure may be accomplished by heating in a vacuum environment or in a protection gas atmosphere. The guide frame 116 carries the mounting area 108 and the signal pins 113 and the power pins 115 of the first electrically conductive structure 104 before the interconnecting. After completing formation of package 120, the guide frame 116 may be separated from the mounting area 108 and the signal pins 113 and the power pins 115 of the first electrically conductive structure 104. Thus, the guide frame 116 can be denoted as a temporary carrier integrally formed with the mounting area 108 and the signal pins 113 and the power pins 115 prior to the separation. Hence, the guide frame 116 may be separated from the manufactured chip carrier 100 later.

The guide frame 116 temporarily, i.e. only during a part of the manufacturing procedure, carries the first electrically conductive structure 104, with which the guide frame 116 can be integrally formed. Alternatively, the guide frame 116 and the first electrically conductive structure 104 may be formed as separate structures. For the purpose of temporarily carrying the first electrically conductive structure 104, the guide frame 116 has a central hole 118 delimited by an annular structure, wherein the first electrically conductive structure 104 is exposed to the sheet 102 in the region of the central hole 118.

As can be taken from FIG. 4, the procedure of FIG. 1 to FIG. 3 continues by forming a layer stack of the thermally conductive and electrically insulating sheet 102 as well as the electrically conductive structures 104, 106. Advantageously, a surface area and lateral extension of the thermally conductive and electrically insulating layer structure 102 are smaller than the surface area and the lateral extension of the electrically conductive structures 104, 106. It is therefore possible that relatively thick electrically conductive structures 104 are used, for instance copper sheets with a thickness of 0.8 mm. The use of asymmetric copper layers is possible. By allowing the lateral extension of the electrically conductive structures 104, 106 to exceed the lateral extension of the thermally conductive and electrically insulating sheet 102, it is possible to freely select the dimension of one or both of the electrically conductive structures 104, 106 in accordance with requirements of an external cooling system. Such requirements relate to cooling surface and corresponding sealing requirements. The dimension of the interior copper layer, i.e. first electrically conductive structure 104, is influenced by the dimension of the one or more electronic chips 110 to be mounted thereon. Also the guiding paths of electric current and of signals as well as required isolation distances can be considered for such a design. It is also possible to design the interior copper layer, i.e. first electrically conductive structure 104, in such a manner that additional properties, such as the provision of an external signal and current supply are met. By taking this measure, it is dispensable to implement a separate leadframe which is conventionally used in DCB substrates.

The connection of the electrically conductive structures 104, 106 made of copper with the thermally conductive and electrically insulating sheet 102 can be carried out in a vacuum oven, preferable in a protection gas atmosphere or in a reducing atmosphere in order to prevent or suppress oxidation of the mounting parts and connection materials. Thermally resistant guiding tools may be implemented which may apply a pressure on the layer stack in order to prevent undesired misalignment or the like, which may improve the result of the manufacturing process (in particular which may suppress the formation of undesired voids in an interior). Moreover, it is possible to make the chip carrier 100 under manufacture subject of a chemical treatment. Such a chemical treatment may remove excessive connection medium 128 which can accumulate on the side edges of the ceramic material of the thermally conductive and electrically insulating sheet 102. On the other hand, such a chemical treatment may render sidewalls of the ceramic structure free of metallic contaminations. Moreover, it is possible to clean, roughen and deoxidize copper surfaces. As a result of this chemical treatment, the copper surfaces of the electrically conductive structures 104, 106 are properly prepared for promoting adhesion with material of an encapsulant to be formed, for instance a mold component.

As mentioned above, the first electrically conductive structure 104 comprises central mounting area 108 (compare the four mounting bases 111) configured for mounting four electronic chips 110. As a further functional element, a periphery portion of the first electrically conductive structure 104 additionally comprises multiple leads 112 for electrically connecting the electronic chips 110. These leads 112 include signal pins 113 carrying electric signals during operation of a package 120 manufactured based on the chip carrier 100. Moreover, the leads 112 include the power pins 115 including a power pin 115 carrying a plus potential, a further power pin 115 carrying a minus potential, and yet another power pin 115 (or several such power pins 115) corresponding to one or more phase connections.

In contrast to this, the second electrically conductive structure 106 is configured as a continuous layer which forms part of an exterior surface of the readily manufactured package 120, i.e. may be exposed to an environment rather than being fully covered by encapsulation material.

Figure 5:
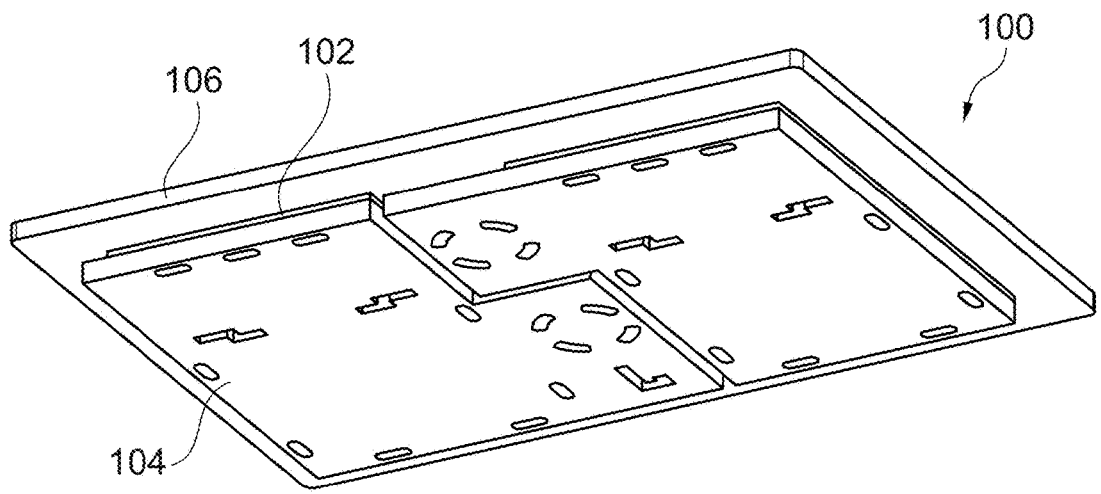
FIG. 5 shows a three-dimensional view of a chip carrier according to an exemplary embodiment of the invention.

FIG. 5 shows a three-dimensional view of a correspondingly manufactured chip carrier 100 according to an exemplary embodiment of the invention. FIG. 5 shows the chip carrier 100 according to FIG. 4 after assembly of its constituents 102, 104, 106, i.e. after their interconnection and after the optional chemical treatment for conditioning the chip carrier 100 for the formation of an encapsulated package 120 shown in FIG. 10 to FIG. 12. As can be taken in particular from FIG. 5, both the first electrically conductive structure 104 and the second electrically conductive structure 106 have a larger thickness than the sheet 102.

In the following, it will be described how a package 120 can be formed based on a chip carrier 100 as manufactured in accordance with FIG. 1 to FIG. 5.

Figure 6:
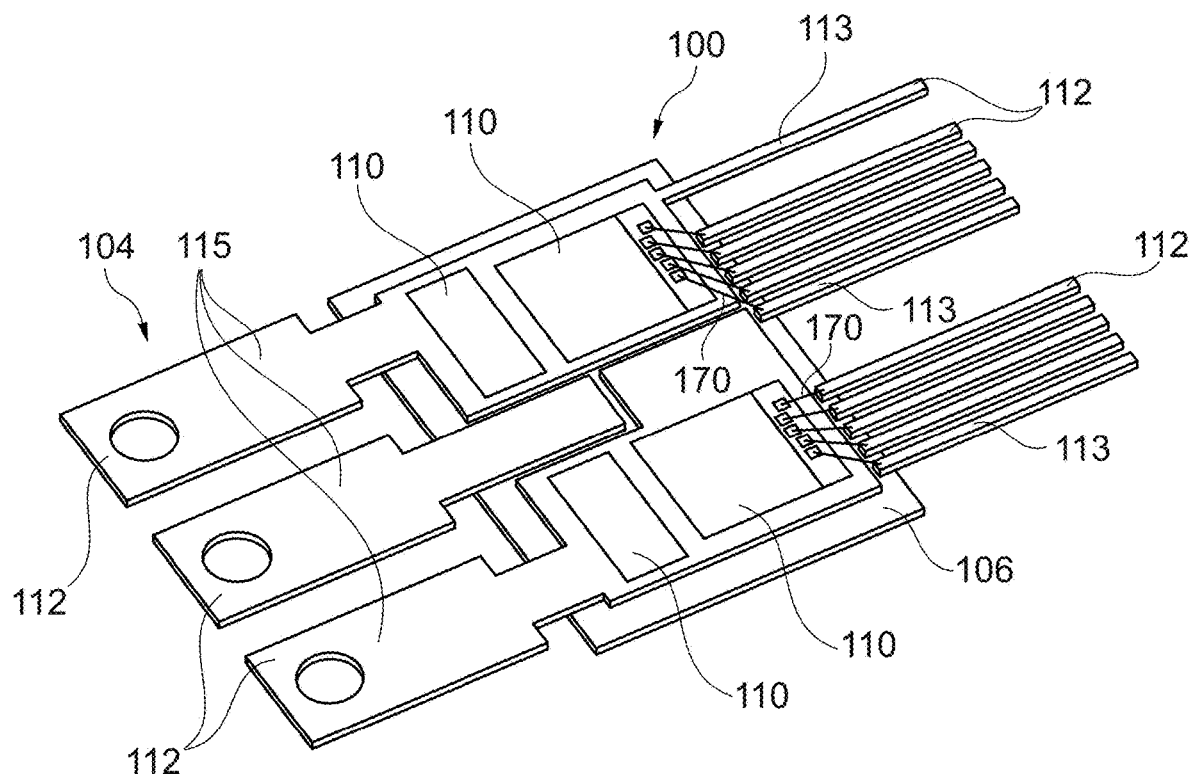
FIG. 6 shows a three-dimensional view of a chip carrier according to an exemplary embodiment of the invention with mounted electronic chips.

FIG. 6 shows a three-dimensional view of a chip carrier 100 according to an exemplary embodiment of the invention with mounted electronic chips 110.

As can be taken from FIG. 6, the electronic chips 110 are mounted on dedicated mounting areas or mounting bases 111 on the electrically conductive structure 104. For instance, these electronic chips 110 may be insulated-gate bipolar transistor (IGBT) and diode chips. Mounting these electronic chips 110 on the first electrically conductive structure 104 may be accomplished by soldering or sintering or gluing.

After that, wire bond pads relating to the electronic chips 110 may be connected with leads 112 (in particular signal pins 113) by wire bonding, see bond wires 170 connecting the signal pins 113 (the power pins 115 may be connected correspondingly by bond wires or bond ribbons, not shown). At this point of time, the signal pins 113 are still connected with the guide frame 116.

Figure 7:
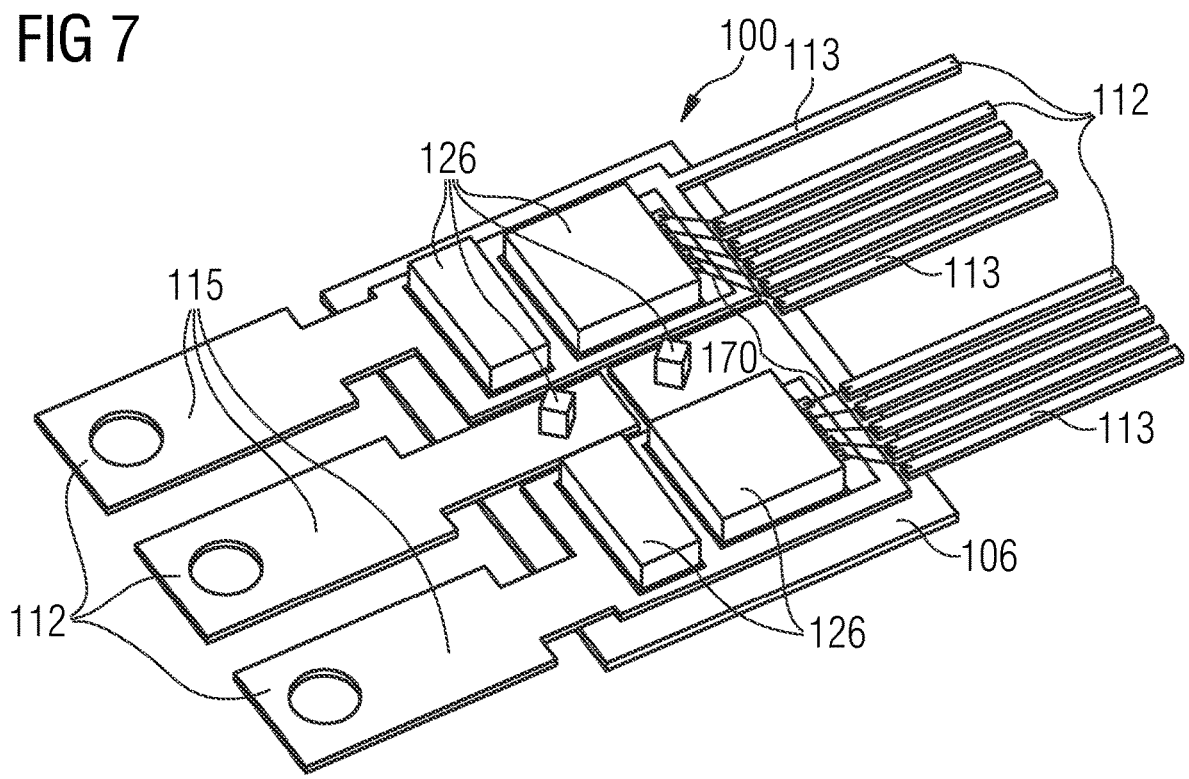
FIG. 7 shows the chip carrier according to FIG. 6 with spacer bodies on the electronic chips.

FIG. 7 shows the chip carrier 100 according to FIG. 6 with spacer bodies 126 on the electronic chips 110.

After the wire bonding, the spacer bodies 126 are mounted on the electronic chips 110. The spacer bodies 126 serve as thermally conductive spacer elements between the electronic chips 110 and an upper chip carrier 124. In addition, two further (smaller) via spacers as further spacer bodies 126 are applied as well in order to provide for a connection between the high side and the low side. More specifically, the via spacer facing the power pins 115 serves for a connection to the low side, whereas the via spacer facing the signal pins 113 serves for a connection between the high side and the low side.

Figure 8:
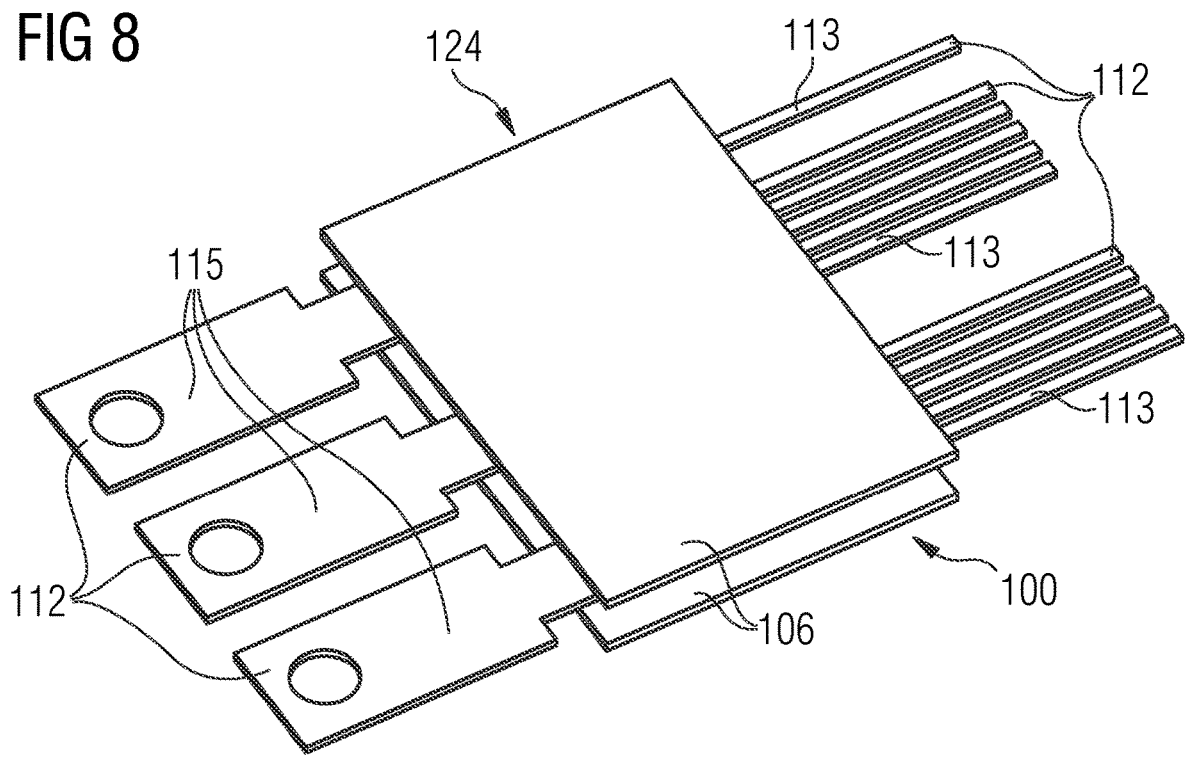
FIG. 8 shows the structure according to FIG. 7 with a further chip carrier attached thereon.

FIG. 8 shows the structure according to FIG. 7 with a further chip carrier 124 attached thereon.

On top of the spacer bodies 126, the upper chip carrier 124 (for instance embodied correspondingly to chip carrier 100, or embodied as Direct Copper Bonding substrate) is mounted, as shown in FIG. 8. The corresponding connections may be made by sintering or soldering or gluing.

Figure 9:
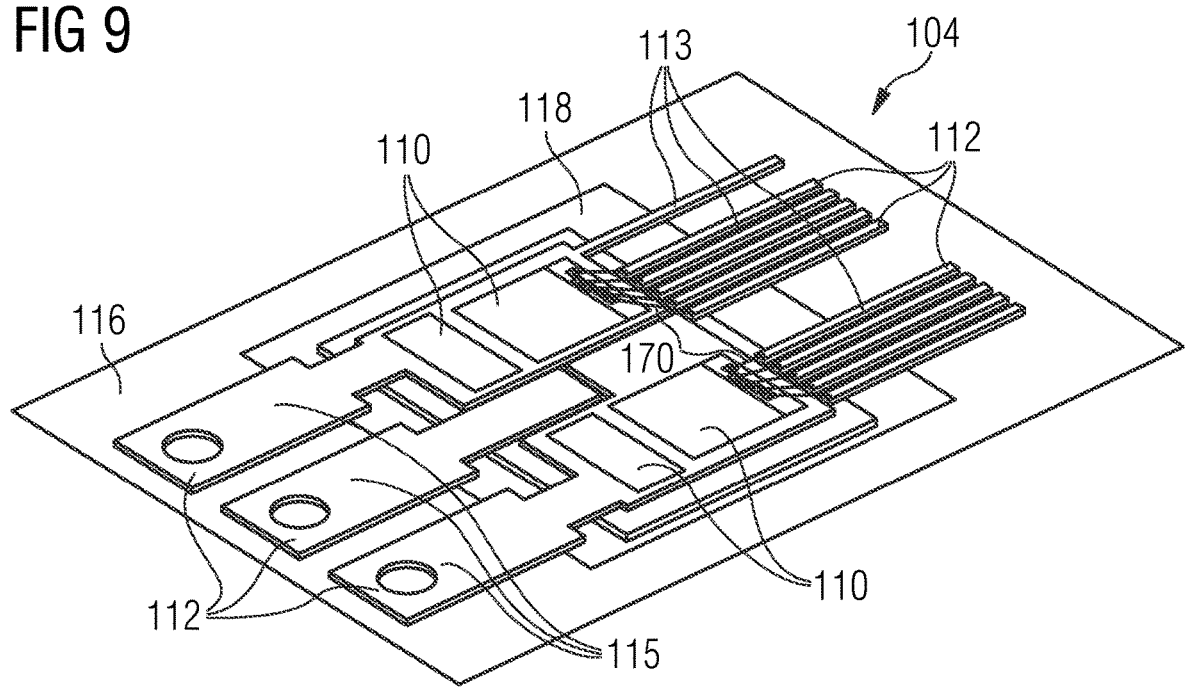
FIG. 9 shows a three dimensional view of a chip carrier according to an exemplary embodiment of the invention which has already electronic chips mounted thereon but has still a temporary guide frame being connected to and supporting a first electrically conductive structure of the chip carrier.

FIG. 9 shows a three dimensional view of a chip carrier 100 according to an exemplary embodiment of the invention which has already electronic chips 110 mounted thereon but has still a temporary guide frame 116 being connected to and supporting a first electrically conductive structure 104 of the chip carrier 100. The guide frame 116 may be removed from the rest when encapsulation during manufacture of package 120 is completed.

Figure 10:
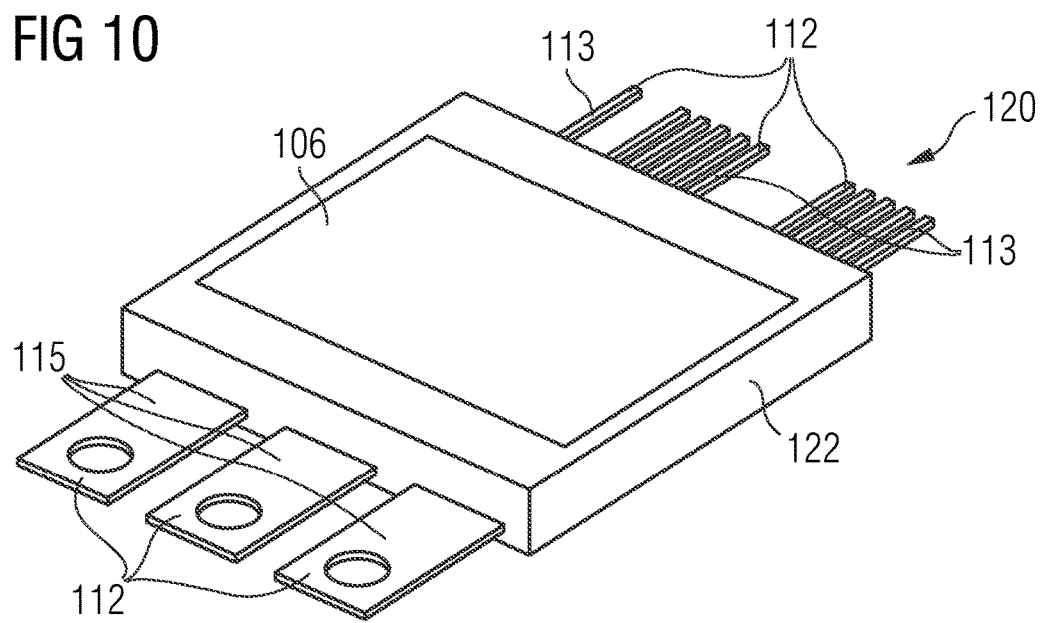
FIG. 10 shows a three-dimensional view of a package according to an exemplary embodiment of the invention.
Figure 11:
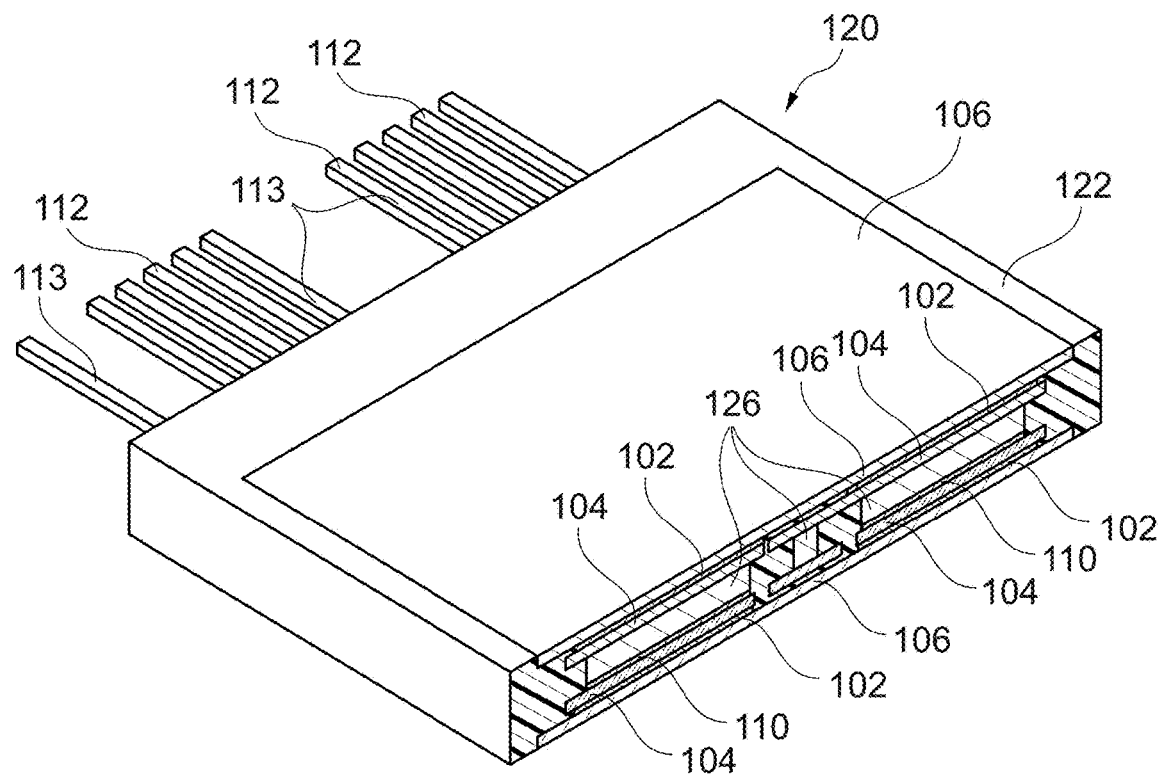
FIG. 11 shows a three-dimensional cross-sectional view of the package according to FIG. 10.
Figure 12:
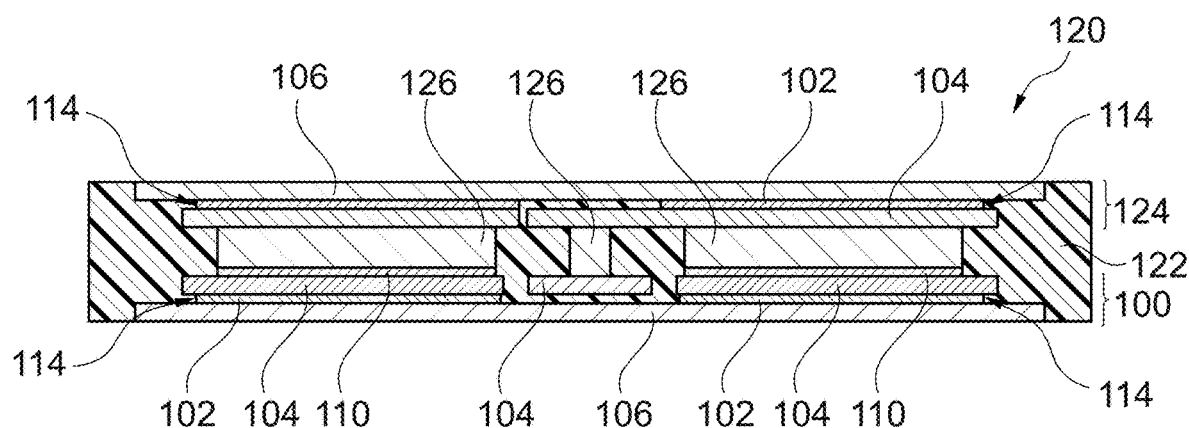
FIG. 12 shows a cross-sectional view of the package according to FIG. 10 and FIG. 11.

FIG. 10 shows a three-dimensional view of a package 120 according to an exemplary embodiment of the invention. FIG. 11 shows a three-dimensional cross-sectional view of the package 120 according to FIG. 10. FIG. 12 shows a cross-sectional view of the package 120 according to FIG. 10 and FIG. 11.

The package 120 is composed of the chip carrier 100 on a bottom side, the further chip carrier 124 on a top side and electronic chips 110 sandwiched between the chip carrier 100 and the further chip carrier 124. More specifically, the electronic chips 110 are mounted on the first electrically conductive structure 104 of the chip carrier 100. The further chip carrier 124, which may be embodied correspondingly to the chip carrier 100 described above referring to FIG. 1 to FIG. 5 or which can be embodied as a Direct Copper Bonding (DCB) substrate, is mounted above the electronic chips 110 on a side opposing the chip carrier 100. Multiple thermally conductive spacer bodies 126, which may be embodied as copper blocks or copper pillars, are arranged vertically between the electronic chips 110 and the further chip carrier 100.

An encapsulant 122, which is here embodied as a mold compound, encapsulates the electronic chips 110, the spacer bodies 126, part of the chip carrier 100, and part of the further chip carrier 124. As can be taken from FIG. 12, the second electrically conductive structure 106 of the chip carrier 100 and the second electrically conductive structure 106 of the further chip carrier 124 form part of an exterior surface of the package 120.

In view of the described configuration with the chip carrier 100 and the further chip carrier 124, the package 120 shown in FIG. 10 to FIG. 13 is configured for double-sided cooling. Heat generated by the electronic chips 110 during operation of the package 120 may be removed from an interior of the package 120 by the chip carrier 100 via a bottom main surface of the package 120 and by the further chip carrier 124 via a top main surface of the package 120. Therefore, a highly efficient cooling may be accomplished.

As can be taken best from FIG. 10, the above described leads 112 of the first electrically conductive structure 104 of the chip carrier 100 extend beyond the encapsulant 122 so that the package 120 can be electrically connected to an electronic periphery.

FIG. 10 is a three-dimensional view of the readily manufactured package 120 after encapsulation with an encapsulant 122. Thus, the exterior shape or outline of the package 120 is defined in a molding procedure. A second task of the mold compound constituting the encapsulant 122 is to fill all regions of the package 120 without voids in order to protect an interior of the package 120 with regard to environmental influences. This also accomplishes a sufficient isolation between the various copper structures in an interior and the exterior of the package 120. Such a mold compound may be selected so as to reliably electrically isolate at a voltage of 10 kV and at a material thickness of 200 μm.

Although not shown in the figures, the package 120 shown in FIG. 10 may then be treated by application of tin on the signal pins and on the power pins. The package 120 may then be separated from the guide frame 116 by removing the latter. It is further possible to bend the signal pins 113 and the power pins 115, if desired.

As can be seen in FIG. 12, a recess 114 or undercut is formed at a lateral edge of a stack composed of the retracted sheet 102, the first electrically conductive structure 104 and the second electrically conductive structure 106. In the readily manufactured package 120, the recess 114 or undercut may be filled by encapsulation material to further improve adhesion.

In the shown embodiment, both chip carriers 100, 124 used for one and the same package 120 having a double-sided cooling performance can be manufactured identically. Alternatively, two different chip carriers 100 may be used for such a package 120. It is also possible that only single-sided cooling is accomplished, in such an embodiment only one chip carrier 100 is used. The use of two chip carriers 100, 124 of the type shown in FIG. 4 can be advantageous when it is desired to guide also from an upper side one or more leads 112 out of the package 120. One application of such an architecture is a parallel guided DC path.

As can be taken from FIG. 12, the respective thermally conductive and electrically insulating sheet 102 is interrupted in a central position in both the carrier 100 and the further carrier 124. By taking this measure, expensive ceramic material may be saved and a compact and light-weight package 120 may be obtained.

As can be taken from the above description, the provided manufacturing architecture for forming chip carrier 100 and package 120 is an integrated solution in which the electrically conductive structures 104, 106 are applied on the thermally conductive and electrically insulating sheet 102 during the manufacturing process. Moreover, the electrically conductive structures 104, 106 may be configured to provide one or more additional functions, such as pins extending beyond the encapsulant 122, a guide frame function (see reference numeral 116), etc. It is also possible to integrate a transport frame function and/or a sealing frame function during the manufacturing procedure.

The package 120 shown in FIG. 10 to FIG. 12 relates to a 700 V one-phase inverter. For further simplifying the manufacturing procedure, multiple electronic chips 110 can be connected, via a carrier frame, to a substrate strip. The guide frame 116, which is later removed, may form part of the upper chip carrier 100. It may provide support during transport and manufacturing process. Although a specific manufacturing procedure has been described above, other manufacturing procedures are possible as well which accomplish a reliable connection between the copper structures and the ceramic sheet.

Figure 13:
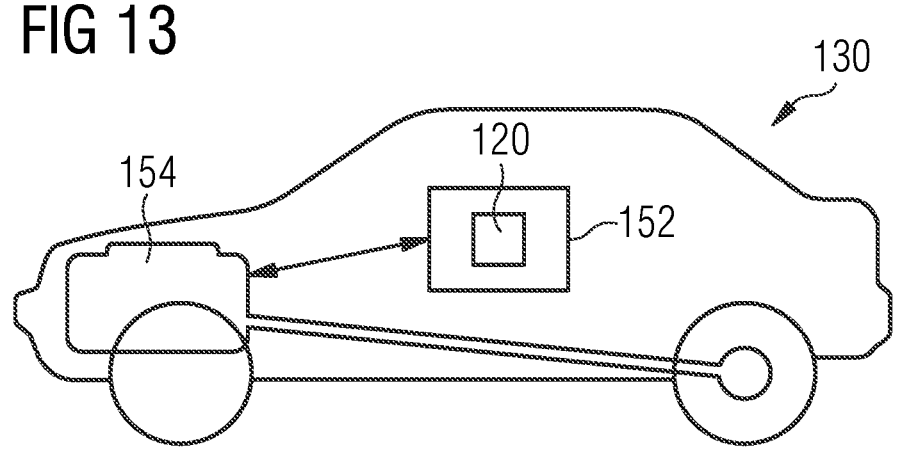
FIG. 13 illustrates schematically a vehicle comprising a power package according to an exemplary embodiment of the invention.

FIG. 13 illustrates schematically a vehicle 130 comprising a power package 120 according to an exemplary embodiment of the invention. More specifically, the power package 120 may form part of a control block 152 controlling operation of engine/battery block 154. Hence, a package 120 or power module according to an exemplary embodiment of the invention may be used for an automotive application. A preferred application of such a power package 120 is an implementation as an inverter circuit or inverted rectifier for vehicle 130 which may be an electrically driven vehicle or which may be a hybrid vehicle. Such an inverter may transfer a direct current (DC) of the battery into an alternating current (AC) for driving the electric engine of vehicle 130. In a hybrid vehicle, it is also possible to at least partially recover mechanical energy and to transfer it, by the inverter, back into electric energy to recharge the battery. In such an automotive inverter application, extreme amounts of heat are generated during operation of the power module 120. This heat can be efficiently removed by the double-sided cooling concept according to FIG. 1 to FIG. 6. However, it should be said that, in other embodiments, also single-sided cooling may be sufficient.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A chip carrier, comprising:
a thermally conductive and electrically insulating sheet;
a first electrically conductive structure on a first main surface of the sheet;
a second electrically conductive structure on a second main surface of the sheet;
wherein the first electrically conductive structure and the second electrically conductive structure extend beyond a lateral edge of the sheet such that a recess or an undercut is formed at a lateral edge of a stack composed of the sheet, the first electrically conductive structure and the second electrically conductive structure;
wherein the first electrically conductive structure comprises at least one mounting area configured for mounting at least one electronic chip, wherein the first electrically conductive structure additionally comprises at least one further functional element, wherein the at least one further functional element comprises at least one lead for electrically connecting the at least one electronic chip.

2. The chip carrier according to claim 1, wherein at least one of the first electrically conductive structure and the second electrically conductive structure has a larger surface area than the sheet.

3. The chip carrier according to claim 1, wherein at least one of the first electrically conductive structure and the second electrically conductive structure has a larger thickness than the sheet.

4. The chip carrier according to claim 1, wherein the second electrically conductive structure is configured as a continuous layer.

5. The chip carrier according to claim 1, wherein the recess or the undercut extends around a perimeter of the chip carrier.

6. The chip carrier according to claim 1, comprising a guide frame integrally formed with the first electrically conductive structure and carrying the first electrically conductive structure.

7. A vehicle, comprising the chip carrier according to claim 1.

8. A package, comprising:
a chip carrier comprising:
a thermally conductive and electrically insulating sheet;
a first electrically conductive structure on a first main surface of the sheet;
a second electrically conductive structure on a second main surface of the sheet:
wherein the first electrically conductive structure and the second electrically conductive structure extend beyond a lateral edge of the sheet such that a recess or an undercut is formed at a lateral edge of a stack composed of the sheet, the first electrically conductive structure and the second electrically conductive structure;

at least one electronic chip mounted on the first electrically conductive structure of the chip carrier;

an encapsulant encapsulating at least part of the at least one electronic chip and at least part of the chip carrier.

9. The package according to claim 8, comprising a further chip carrier mounted on or above the at least one electronic chip on a side opposing the chip carrier.

10. The package according to claim 9, wherein the further chip carrier is a chip carrier comprising:
a thermally conductive and electrically insulating sheet;
a first electrically conductive structure on a first main surface of the sheet;
a second electrically conductive structure on a second main surface of the sheet;
wherein the first electrically conductive structure and the second electrically conductive structure extend beyond a lateral edge of the sheet such that a recess or an undercut is formed at a lateral edge of a stack composed of the sheet, the first electrically conductive structure and the second electrically conductive structure.

11. The package according to claim 9, comprising at least one spacer body between the at least one electronic chip and the further chip carrier.

12. The package according to claim 9, wherein the second electrically conductive structure of at least one of the chip carrier and the further chip carrier forms part of an exterior surface of the package.

13. The package according to claim 8, wherein at least one lead of the first electrically conductive structure of the chip carrier extends beyond the encapsulant.

14. The package according to claim 8, wherein the encapsulant extends into the undercut or the recess.

15. The package according to claim 8, wherein at least one lead of the first electrically conductive structure of the chip carrier is electrically connected with the at least one electronic chip.

16. A method of using the package according to claim 8 for an automotive application.

17. A method of manufacturing a chip carrier, wherein the method comprises:
interconnecting a thermally conductive and electrically insulating sheet, a first electrically conductive structure on a first main surface of the sheet, and a second electrically conductive structure on a second main surface of the sheet;
configuring the first electrically conductive structure and the second electrically conductive structure to extend beyond a lateral edge of the sheet, such that a recess or an undercut is formed at a lateral edge of a stack composed of the sheet, the first electrically conductive structure and the second electrically conductive structure;
wherein the first electrically conductive structure comprises at least one mounting area configured for mounting at least one electronic chip, wherein the first electrically conductive structure additionally comprises at least one further functional element, wherein the at least one further functional element comprises at least one lead for electrically connecting the at least one electronic chip.

18. The method according to claim 17, wherein the method comprises providing a connecting medium between the sheet and at least one of the first electrically conductive structure and the second electrically conductive structure.

19. The method according to claim 18, wherein the connecting medium comprises a solder material.

20. The method according to claim 17, wherein the interconnecting comprises heating.

21. The method according to claim 17, wherein the method comprises providing a guide frame integrally formed with the first electrically conductive structure and carrying the first electrically conductive structure before the interconnecting and removing the guide frame from the manufactured chip carrier after formation of a package using the chip carrier.

22. The method according to claim 17, wherein the method comprises roughening at least one of the first electrically conductive structure and the second electrically conductive structure.

23. A method of manufacturing a package, wherein the method comprises:
providing a chip carrier comprising:
a thermally conductive and electrically insulating sheet;
a first electrically conductive structure on a first main surface of the sheet;
a second electrically conductive structure on a second main surface of the sheet;
wherein the first electrically conductive structure and the second electrically conductive structure extend beyond a lateral edge of the sheet such that a recess or an undercut is formed at a lateral edge of a stack composed of the sheet, the first electrically conductive structure and the second electrically conductive structure;
mounting at least one electronic chip on the first electrically conductive structure of the chip carrier;
encapsulating at least part of the at least one electronic chip and at least part of the chip carrier by an encapsulant.

* * * * *